United States Patent
Chen et al.

(10) Patent No.: US 11,195,788 B2
(45) Date of Patent: Dec. 7, 2021

(54) HYBRID DIELECTRIC SCHEME IN PACKAGES

(71) Applicant: Taiwan Semiconductor Manufacturing Company, Ltd., Hsinchu (TW)

(72) Inventors: Chien-Hsun Chen, Zhutian Township (TW); Jiun Yi Wu, Zhongli (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/656,642

(22) Filed: Oct. 18, 2019

(65) Prior Publication Data

US 2021/0118787 A1 Apr. 22, 2021

(51) Int. Cl.
*H05K 3/40* (2006.01)
*H01L 23/498* (2006.01)
*H01L 21/48* (2006.01)
*H01L 23/66* (2006.01)

(52) U.S. Cl.
CPC ...... *H01L 23/49822* (2013.01); *H01L 21/481* (2013.01); *H01L 21/4853* (2013.01); *H01L 21/4857* (2013.01); *H01L 23/49833* (2013.01); *H01L 23/49838* (2013.01); *H01L 23/49894* (2013.01); *H01L 23/66* (2013.01); *H05K 3/4038* (2013.01); *H01L 2223/6638* (2013.01)

(58) Field of Classification Search
CPC ............ H05K 3/4038; H01L 23/49822; H01L 23/49894; H01L 23/49833; H01L 23/49838; H01L 23/66; H01L 2223/6638; H01L 21/4853; H01L 21/4857; H01L 21/481; Y10T 29/49128; Y10T 29/4913; Y10T 29/49146; Y10T 29/49155; Y10T 29/49165
USPC .......................... 29/831, 832, 841, 846, 852
See application file for complete search history.

(56) References Cited

U.S. PATENT DOCUMENTS

| | | | |
|---|---|---|---|
| 6,418,615 B1 * | 7/2002 | Rokugawa | H01L 23/49811 29/832 |
| 8,941,244 B1 * | 1/2015 | Tsai | H01L 21/486 257/774 |
| 9,601,353 B2 * | 3/2017 | Huang | H01L 23/49811 |
| 9,635,753 B2 * | 4/2017 | Hasegawa | H05K 1/0245 |

(Continued)

FOREIGN PATENT DOCUMENTS

| | | |
|---|---|---|
| DE | 102018123492 A1 | 9/2019 |
| JP | 2019071393 A | 5/2019 |

(Continued)

*Primary Examiner* — Donghai D Nguyen
(74) *Attorney, Agent, or Firm* — Slater Matsil, LLP

(57) ABSTRACT

A method includes forming a first redistribution line, forming a polymer layer including a first portion encircling the first redistribution line and a second portion overlapping the first redistribution line, forming a pair of differential transmission lines over and contacting the polymer layer, and molding the pair of differential transmission lines in a molding compound. The molding compound includes a first portion encircling the pair of differential transmission lines, and a second portion overlapping the pair of differential transmission lines. An electrical connector is formed over and electrically coupling to the pair of differential transmission lines.

20 Claims, 18 Drawing Sheets

(56) References Cited

U.S. PATENT DOCUMENTS

| | | |
|---|---|---|
| 10,629,540 B2 | 4/2020 | Yu et al. |
| 10,804,191 B2 | 10/2020 | Sakamoto et al. |
| 11,069,671 B2 | 7/2021 | Pei et al. |
| 2010/0144099 A1 | 6/2010 | Kwon et al. |
| 2016/0293557 A1 | 10/2016 | Topak et al. |
| 2019/0058231 A1 | 2/2019 | Jou et al. |

FOREIGN PATENT DOCUMENTS

| | | |
|---|---|---|
| KR | 20150138059 A | 12/2015 |
| KR | 20190036485 A | 4/2019 |
| KR | 20190111735 A | 10/2019 |

* cited by examiner

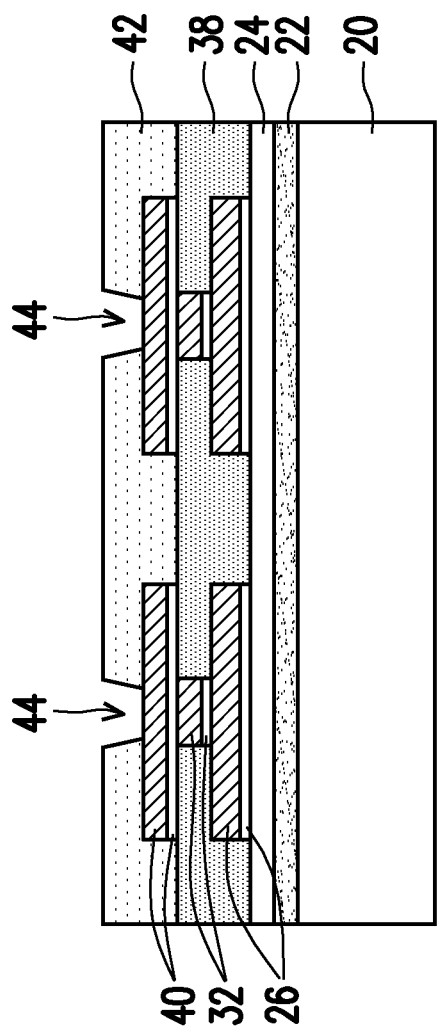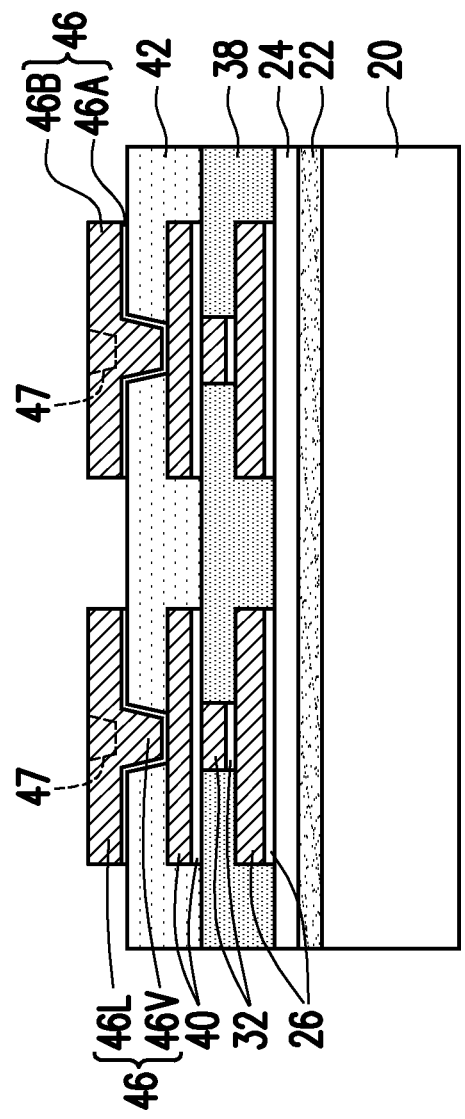

HYBRID DIELECTRIC SCHEME IN PACKAGES

BACKGROUND

With the evolving of semiconductor technologies, some semiconductor chips/dies are becoming increasingly smaller. In the meantime, more functions need to be integrated into the semiconductor dies, which also cause other semiconductor dies and the resulting packages to become increasingly larger.

Redistribution lines are formed in the package substrates for routing the power and signals in packages. Transmission lines are formed as parts of the redistribution lines, and also become very long when the packages become larger, sometimes as long as tens of millimeters. The long transmission lines have high resistance values, and cause significant insertion loss, especially for high-speed signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 15 illustrate the cross-sectional views of intermediate stages in the formation of a die stack in accordance with some embodiments.

DETAILED DESCRIPTION

Figure 1:
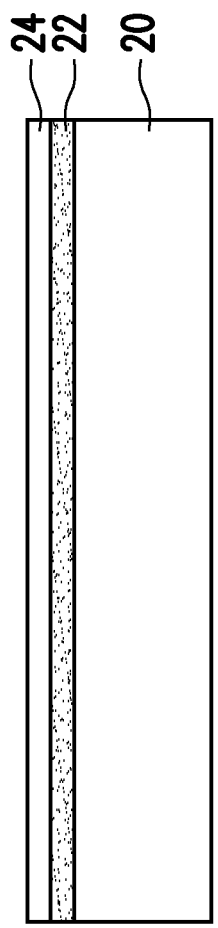

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with some embodiments. The intermediate stages in the formation of the package are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, the package includes high-speed transmission lines, which may be differential transmission lines. In accordance with some embodiments, a transmission line has an overlying dielectric layer and an underlying dielectric layer. The overlying dielectric layer and the underlying dielectric layer may be formed of different materials, and may be formed using different methods, so that one of the overlying dielectric layer and the underlying dielectric layer may have a thickness significantly greater than the other. The transmission lines in this structure may have a great line width for reduced insertion loss, while can maintain an intended impedance.

Figure 22:
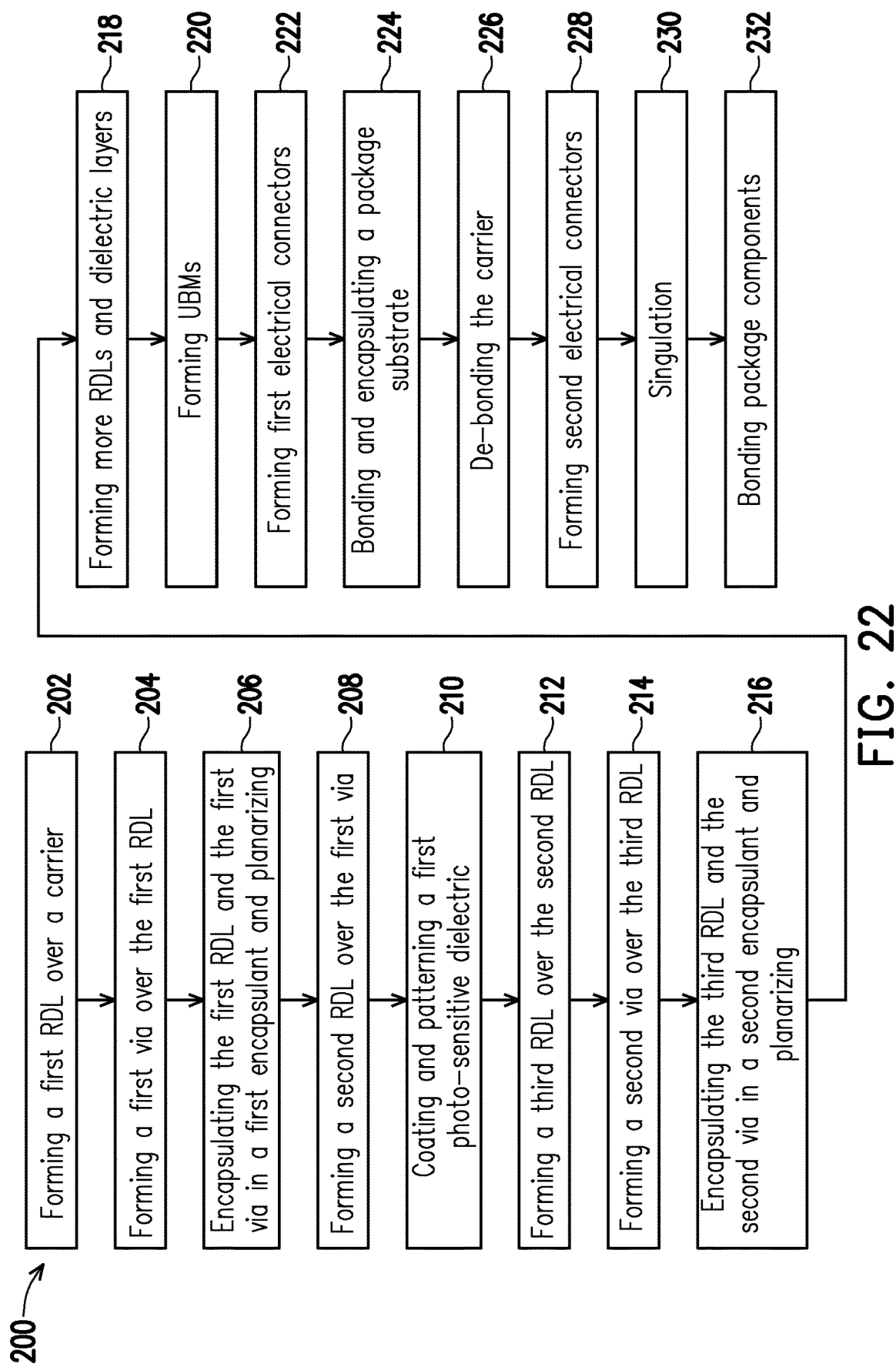
FIG. 22 illustrates a process flow for forming a package in accordance with some embodiments.

FIGS. 1 through 15 illustrate the cross-sectional views of intermediate stages in the formation of a package in accordance with some embodiments of the present disclosure. The corresponding processes are also reflected schematically in the process flow 200 shown in FIG. 22. Referring to FIG. 1, carrier 20 is provided, and release film 22 is coated on carrier 20. Carrier 20 is formed of a transparent material, and may be a glass carrier, a ceramic carrier, an organic carrier, or the like. Release film 22 is in physical contact with the top surface of carrier 20. Release film 22 may be formed of a Light-To-Heat-Conversion (LTHC) coating material, which is applied on carrier 20 through coating. In accordance with some embodiments of the present disclosure, the LTHC coating material is capable of being decomposed under the heat of light/radiation (such as laser), and hence can release carrier 20 from the structure formed thereon. In accordance with some embodiments, as also shown in FIG. 1, dielectric buffer layer 24 is formed on LTHC coating material 22. In accordance with some embodiments, dielectric buffer layer 24 is formed of a polymer-based material. For example, dielectric buffer layer 24 may be formed of polybenzoxazole (PBO), polyimide, benzocyclobutene (BCB), or other applicable polymers.

Figure 2:
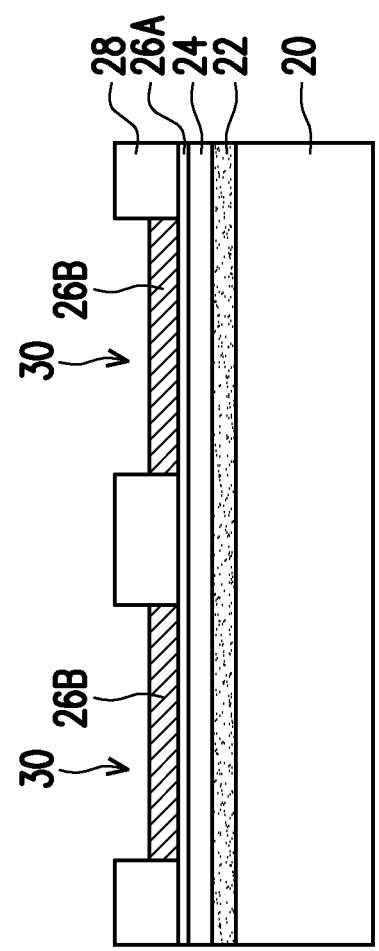
Figure 3:
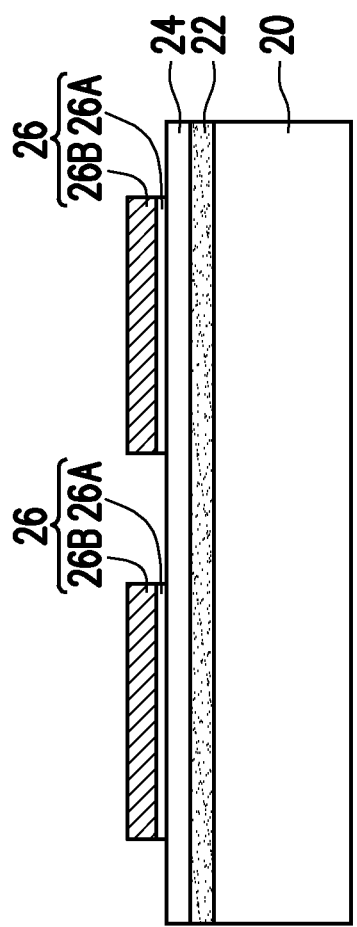

FIGS. 2 and 3 illustrate the formation of Redistribution Lines (RDLs) 26 on dielectric buffer layer 24. The respective process is illustrated as process 202 in the process flow 200 shown in FIG. 22. Referring to FIG. 2, metal seed layer 26A is formed. Metal seed layer 26A is formed as a blanket layer, which may include an adhesion layer and a copper-containing layer in accordance with some embodiments. The adhesion layer may be formed of titanium, titanium nitride, tantalum, tantalum nitride, or the like. The copper-containing layer may be formed of substantially pure copper or a copper alloy. The formation methods and the materials of metal seed layer 26A may include Physical Vapor Deposition (PVD), Plasma Enhance Chemical Vapor Deposition (PECVD), Atomic Layer deposition (ALD), or the like. Patterned plating mask 28, which may be formed of photo resist, is then formed over metal seed layer 26A. Openings 30 are formed to expose some portions of metal seed layer 26A. Next, metal regions (RDLs) 26B are formed in openings 30, for example, through electro-chemical plating. RDLs 26B may be formed of copper or a copper alloy, aluminum, nickel, palladium, alloys thereof, or multiple layers thereof.

After the formation of RDLs 26B, plating mask 28 is removed, exposing the underlying portions of metal seed layer 26A. Next, the exposed portions of metal seed layer 26A are etched, and the remaining portions are also denoted as metal seed layer 26A. The resulting structure is shown in FIG. 3. Throughout the description, the remaining portions of metal seed layer 26A are also considered as being parts of the RDLs, and hence 26A and 26B are collectively referred to as RDLs 26.

Figure 4:
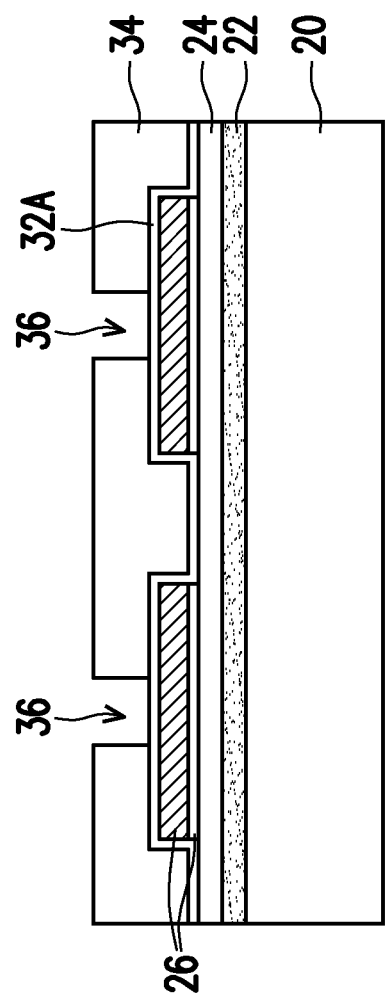
Figure 5:
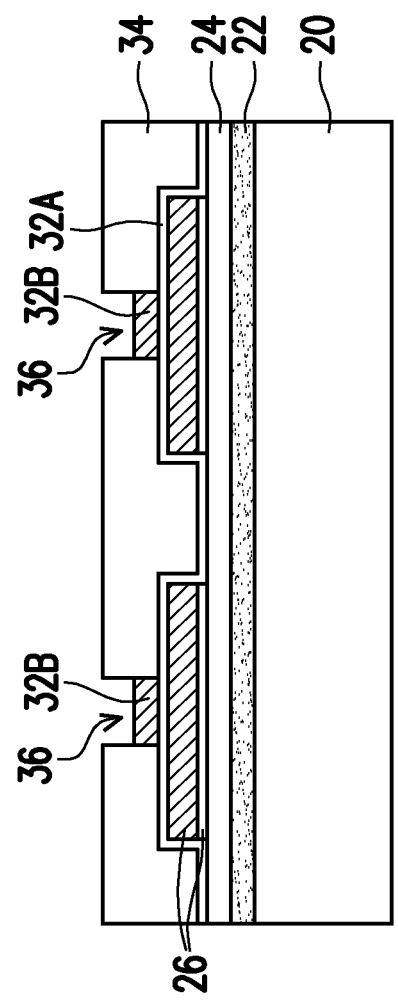
Figure 6:
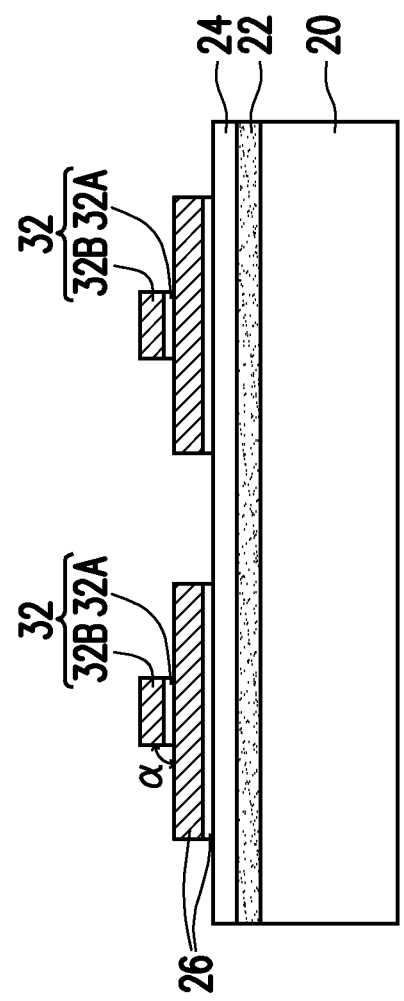

FIGS. 4 through 6 illustrate the cross-sectional views of intermediate stages in the formation of vias 32 in accordance with some embodiments of the present disclosure. The respective process is illustrated as process 204 in the process flow 200 shown in FIG. 22. Referring to FIG. 4, metal seed layer 32A is formed. The formation methods and the materials of metal seed layer 32A may be similar to that of the metal seed layer 26A shown in FIG. 2, and hence are not repeated herein. Metal seed layer 32A covers the top surfaces and the sidewalls of RDLs 26, and extends on the top surface of dielectric buffer layer 24. Patterned plating mask 34, which may be formed of photo resist, is then formed, with openings 36 formed in plating mask 34 and overlapping some portions of RDLs 26.

Next, as shown in FIG. 5, vias 32B are formed in openings 36, for example, through plating. After the formation of vias 32B, plating mask 34 is removed, exposing the underlying portions of metal seed layer 32A. Next, the exposed portions of metal seed layer 32A are etched, and the remaining portions are also denoted as 32A. The resulting structure is shown in FIG. 6. The remaining portions of metal seed layer 32A are considered as being parts of RDLs, and vias 32B and the remaining portions of metal seed layer 32A are in collectively referred to as vias 32 hereinafter. Due to the formation process, the edges of vias 32 are substantially vertical and straight, for example, with tilt angle α being in the range between about 85 degrees and 90 degrees, and may be in the range between about 88 degrees and 90 degrees.

Figure 7:
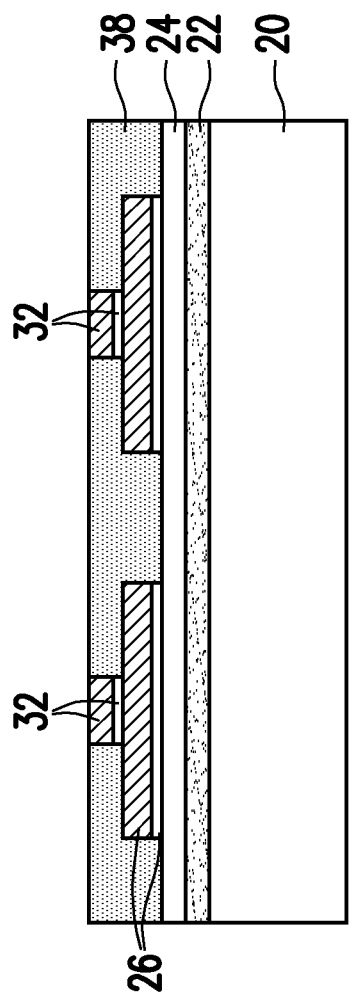

Referring to FIG. 7, dielectric layer 38 is formed to encapsulate both of RDLs 26 and vias 32 therein. The respective process is illustrated as process 206 in the process flow 200 shown in FIG. 22. Dielectric layer 38 is filled to a level higher than the top surfaces of vias 32. In accordance with some embodiments, dielectric layer 38 comprises or is a molding compound, a molding underfill, an epoxy, and/or a resin. The top surface of dielectric layer 38, as dispensed, is higher than the top ends of vias. When formed of molding compound or molding underfill, dielectric layer 38 may include a base material, which may be a polymer, a resin, an epoxy, or the like, and filler particles (not shown, refer to FIG. 21) in the base material. The filler particles may be dielectric particles of $SiO_2$, $Al_2O_3$, silica, or the like, and may have spherical shapes. Also, the spherical filler particles may have a plurality of different diameters. Since dielectric layer 38 may include different materials such as the base material and the filler particles, dielectric layer 38 may be formed of a heterogeneous material(s).

In accordance with alternative embodiments, dielectric layer 38 is formed of a homogenous material. The homogeneous material may be a photo-sensitive material or a non-photo sensitive material. For example, the homogeneous material may be or comprise PBO, polyimide, a resin, an epoxy, or the like. The formation process may include dispensing the homogenous dielectric layer 38 in a flowable form, curing the dielectric layer, and then performing a planarization process to reveal vias 32. Dielectric layer 38 may also be formed of an inorganic material such as silicon oxide, silicon nitride, or the like.

In a subsequent step, as shown in FIG. 7, a planarization process such as a Chemical Mechanical Polish (CMP) process or a mechanical grinding process is performed to planarize dielectric layer 38, until vias 32 are exposed. Due to the planarization process, the top ends of vias 32 are substantially level (coplanar) with the top surfaces of dielectric layer 38.

Figure 8:
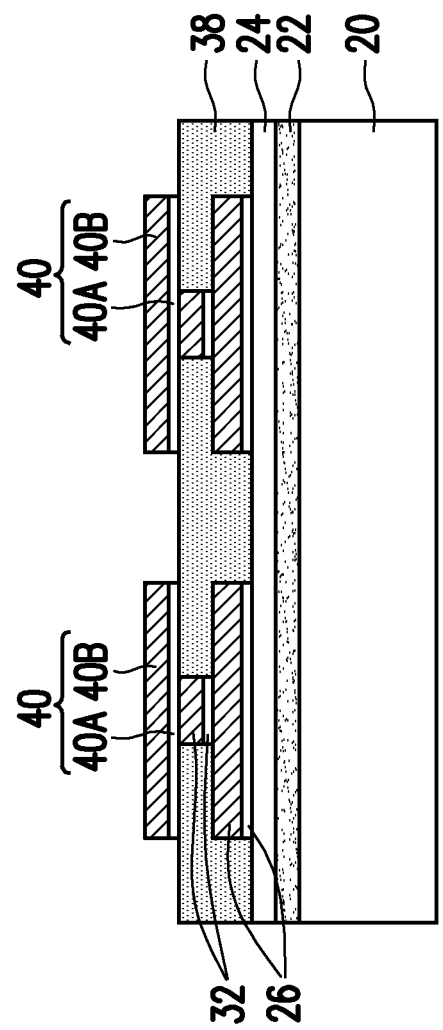

FIG. 8 illustrates the formation of RDLs 40, which may include metal seed layer 40A and the plated metal region (RDLs) 40B. The respective process is illustrated as process 208 in the process flow 200 shown in FIG. 22. In accordance with some embodiments of the present disclosure, the formation of RDLs 40 may include depositing a blanket metal seed layer, forming a patterned plating mask over the blanket metal seed layer, plating the metal regions 40B, removing the plating mask, and etching the exposed portions of the metal seed layer. The materials of RDLs 40 may be selected from the same group of candidate materials for forming RDLs 26, and are not repeated herein.

FIG. 9 illustrates the coating and the patterning of dielectric layer 42. The respective process is illustrated as process 210 in the process flow 200 shown in FIG. 22. In accordance with some embodiments, dielectric layer 42 is formed of a photo-sensitive material, which may be a polymer formed of or comprising polyimide, PBO, or the like. Dielectric layer 42 may be dispensed in a flowable form, and is then cured. Due to the coating process, there may not be a planarization process to planarize the top surface of dielectric layer 42. The formation processes include coating dielectric layer 42, performing a light-exposure process on dielectric layer 42 (for example, using a patterned photo lithography mask), and developing dielectric layer 42. Some portions of dielectric layer 42 are removed in the developing process to form openings 44. Due to the formation process, the edges of openings 44 are slanted and straight.

Referring to FIG. 10, RDLs 46 are formed, which may include metal seed layer 46A and the plated metal regions 46B. The respective process is illustrated as process 212 in the process flow 200 shown in FIG. 22. In accordance with some embodiments of the present disclosure, the formation of RDLs 46 includes depositing a blanket metal seed layer, which extends into openings 44 (FIG. 9), and forming a patterned plating mask (not shown) over the blanket metal seed layer. Metal regions 46B are then formed, for example, through plating. The plating mask is then removed, for example, through an ashing process. The portions of the metal seed layer that were previously covered by the plating mask are then etched, resulting in the RDLs 46 shown in FIG. 10. The materials of RDLs 46 may be selected from the same group of candidate materials used for forming RDLs 26, and are not repeated herein.

RDLs 46 include line portions 46L, which are over dielectric layer 42, and via portions 46V, which extend into dielectric layer 42. In accordance with some embodiments of the present disclosure, some portions of the top surfaces of RDLs 46 directly over vias 46V may be recessed due to the topology caused by openings 44. The recessed top surfaces of RDLs 46 are illustrated by dashed lines 47 in accordance with some example embodiments. In accordance with other embodiments, the plating process is adjusted so that the top surfaces of the line portions 46L directly over via portions 46V are planar or even higher than the top surfaces of the portions of line portions 46L overlapping dielectric layer 42. Due to the formation process, the edges of vias 46V are slanted, for example, with tilt angle β being smaller than about 85 degrees, or smaller than about 80 degrees or about 75 degrees.

As shown in FIGS. 9 and 10, since dielectric layer 42 is formed a homogenous material, it is possible to pattern dielectric layer 42 (as shown in FIG. 9) to form openings 44. Line portions 46L and via portions 46V thus can be formed in a same process. As a comparison, since dielectric layer 38 may be heterogeneous, and the base material and the filler particles therein have different etching rates, it is difficult to etch dielectric layer 38. Accordingly, vias 32 and RDLs 40 are formed in separate processes, which result in the increase in the manufacturing cost. The increased cost, however, results in a benefit of being able to adjust the thickness of dielectric layer 38 to have a desirable value, which may be greater than 15 μm, and may be in the range between about 20 μm and about 40 μm. As a comparison, when dielectric layer 42 is formed of a photo-sensitive material, due to the limitation of the exposure, the thickness of dielectric layer 42 is limited, for example, to be smaller than about 15 μm.

Figure 11:
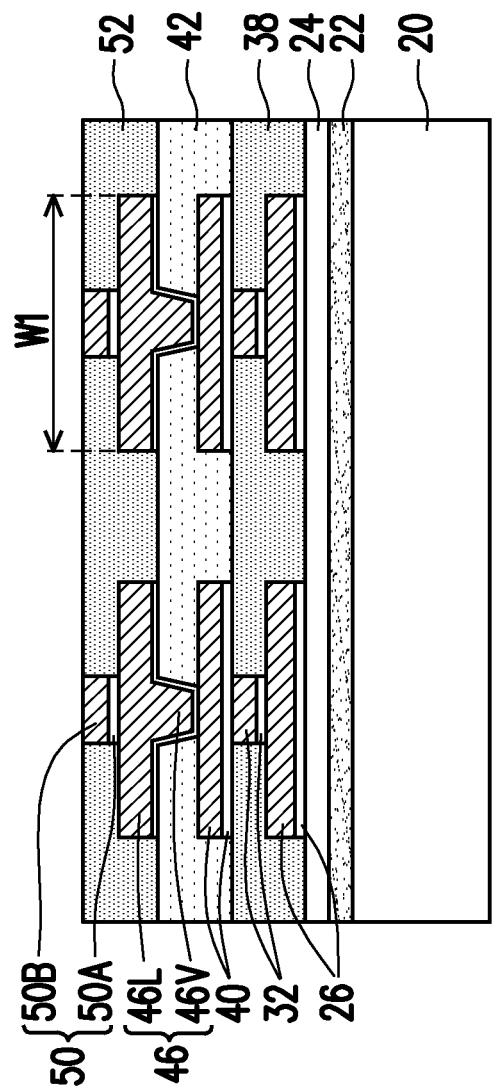

FIG. 11 illustrates the formation of vias 50, which includes metal seed layers 50A and metal regions (RDLs) 50B. The respective process is illustrated as process 214 in the process flow 200 shown in FIG. 22. In accordance with some embodiments, the formation processes for forming vias 50 include depositing a blanket metal seed layer, forming a patterned plating mask (not shown) over the blanket metal seed layer, plating the metal regions 50B, removing the plating mask, and etching the exposed portions of the metal seed layer. The materials of vias 50 may be selected from the same group of candidate materials used for forming 32, and hence are not repeated herein.

Next, dielectric layer 52 is formed to encapsulate RDL line portions 46L and vias 50 therein. The respective process is illustrated as process 216 in the process flow 200 shown in FIG. 22. Dielectric layer 52 may be formed of a material selected from the same candidate materials for forming dielectric layer 38, and may be formed of or comprise a molding compound, a molding underfill, an epoxy, a resin, an inorganic dielectric material, or the like. A planarization process such as a CMP process or a mechanical grinding process is then performed to planarize dielectric layer 52 until vias 50 are exposed. The respective process is also illustrated as process 216 in the process flow 200 shown in FIG. 22. Due to the planarization process, the top ends of vias 50 are substantially level (coplanar) with the top surfaces of dielectric layer 52.

Figure 12:
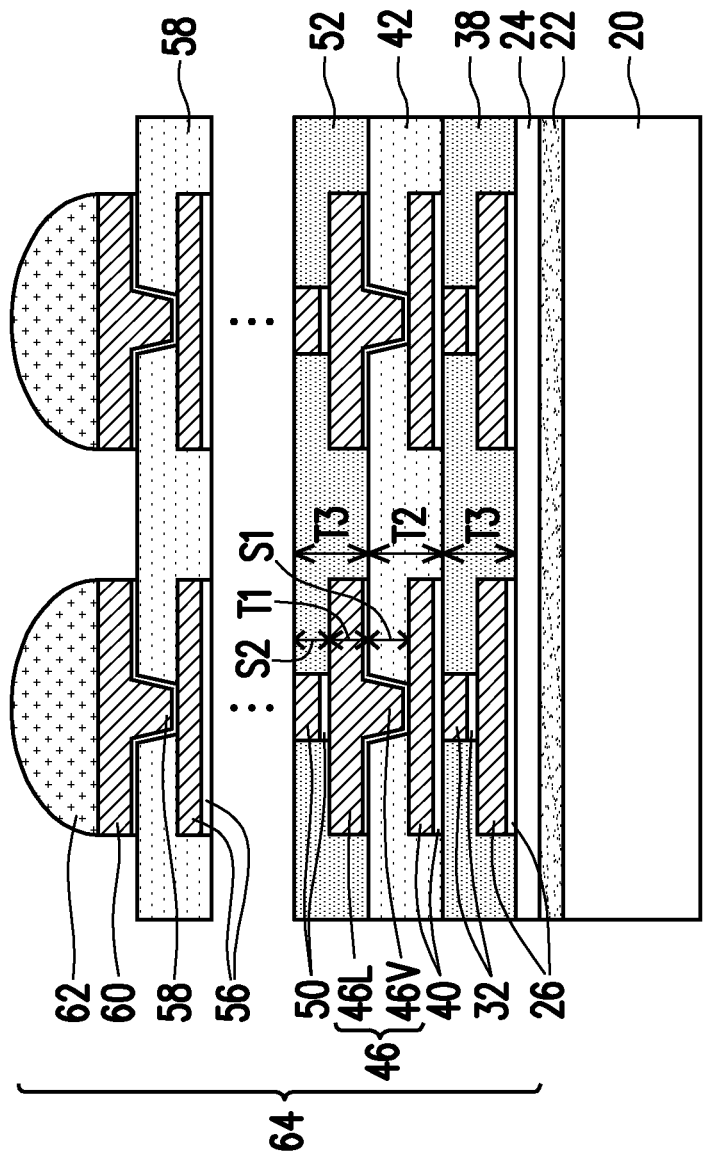

FIG. 12 illustrates the formation of more overlying features including RDLs 56 and dielectric layer 58. The respective process is illustrated as process 218 in the process flow 200 shown in FIG. 22. For example, some of the overlying layers, which are represented by dots, may represent the similar layered structure similar to the structure including dielectric layers 42 and 52 and the conductive features 40, 46 and 50. In accordance with some embodiments, the subsequently formed dielectric layers and the previously formed dielectric layers 38, 42, and 52 collectively adopt an alternating layout, with some of the layers formed of homogenous materials, and other layers formed of heterogeneous materials. Each layer formed of a homogenous material may be inserted between, and contacting, two layers formed of heterogeneous materials, and each layer formed of a heterogeneous material may be inserted between, and contacting, two layers formed of homogenous materials. For example, layers 24, 42, and 58 may be formed of homogenous materials, while layers 38 and 52 may be formed of heterogeneous materials. The conductive features in the overlying structures may also adopt the structures of RDLs 46 and 50, depending on the materials of the respective dielectric layers.

Under-Bump Metallurgies (UBMs) 60 and electrical connectors 62 are also formed. The respective process is illustrated as processes 220 and 222 in the process flow 200 shown in FIG. 22. UBMs 60 may be formed similar to the formation of RDLs 46, and may include an adhesion layer (such as a titanium layer) and an overlying copper layer. Electrical connectors 62 may be or include solder regions, for example. Throughout the description, the features overlying release film 22 are collectively referred to as composite package substrate 64. Composite package substrate 64 is free from device dies and active devices therein.

In accordance with some embodiments of the present disclosure, the thicknesses T1 of RDL line portions 46L and RDLs 26, 40, and 56 are in the range between about 1 μm and about 20 μm. The thicknesses T2 of homogeneous layer 42 (and the overlying homogenous layers) may be in the range between about 3 μm and about 30 μm. The thicknesses T3 of heterogeneous layers 38 and 52 (and the overlying heterogeneous layers) may be in the range between about 5 μm and about 50 μm. Thickness T3 is greater than thickness T2, and ratio T3/T2 may be in the range between about 1.5 and about 3.0. The spacing S1 between line portions 46L and the underlying RDLs 40 may be in the range between about 2 μm and about 30 μm. The spacing S2 between line portions 46L and the overlying RDLs (not shown) may be in the range between about 5 μm and about 40 μm. The ratio S2/S1 is greater than 1.0, and may be in the range between about 1.5 and about 3.0 in accordance with some embodiments.

Figure 13:
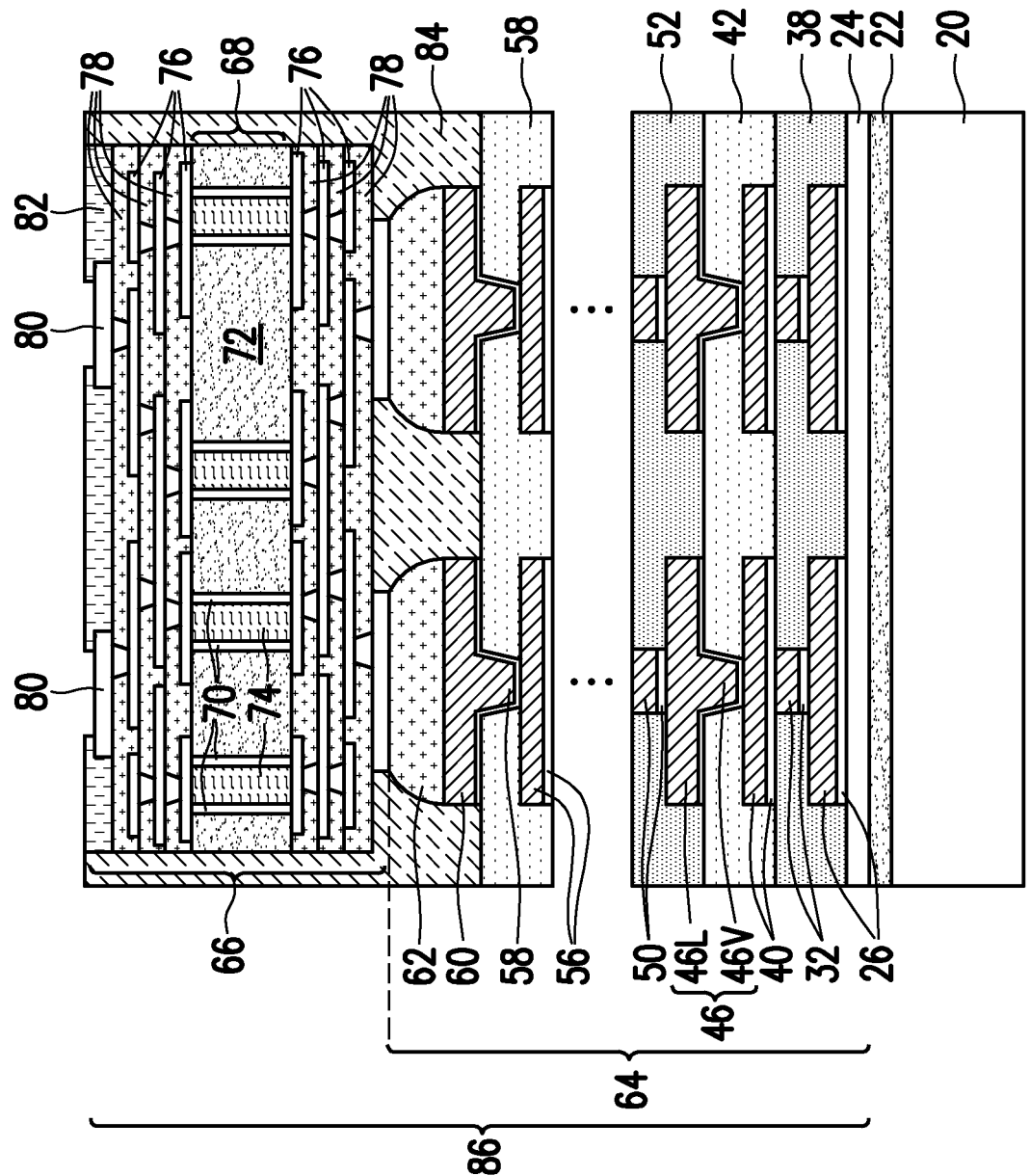

FIG. 13 illustrates the bonding of package substrate 66 to composite package substrate 64. The respective process is illustrated as process 224 in the process flow 200 shown in FIG. 22. Although one package substrate 66 is illustrated, there may be a plurality of identical package substrates 66 bonded to composite package substrate 64. In accordance with some embodiments, package substrate 66 includes core 68, which includes core dielectric 72, conductive pipes 70 penetrating through core dielectric 72, and dielectric filling material 74 inside conductive pipes 70. In accordance with some embodiments, core dielectric 72 is formed of fiber glass, an epoxy, a resin, prepreg, or the like. RDLs 76 and dielectric layers 78 are formed on the opposite sides of core 68, and may be interconnected through conductive pipes 70. Bonding pads 80 may be connected to RDLs 76. Dielectric layer 82 may cover the edge portions of bonding pads 80, with the central portions of bonding pads 80 revealed. Dielectric layer 82 may be formed of solder mask, for example.

In accordance with some embodiments, encapsulant 84, which may be formed of a molding underfill, a molding compound, or the like, is dispensed to encapsulate package substrates 66 therein. The respective process is also illustrated as process 224 in the process flow 200 shown in FIG. 22. Encapsulant 84 is in contact with the sidewalls of package substrates 66. The structure over release film 22 is referred to a composite package component 86 hereinafter.

Figure 14:
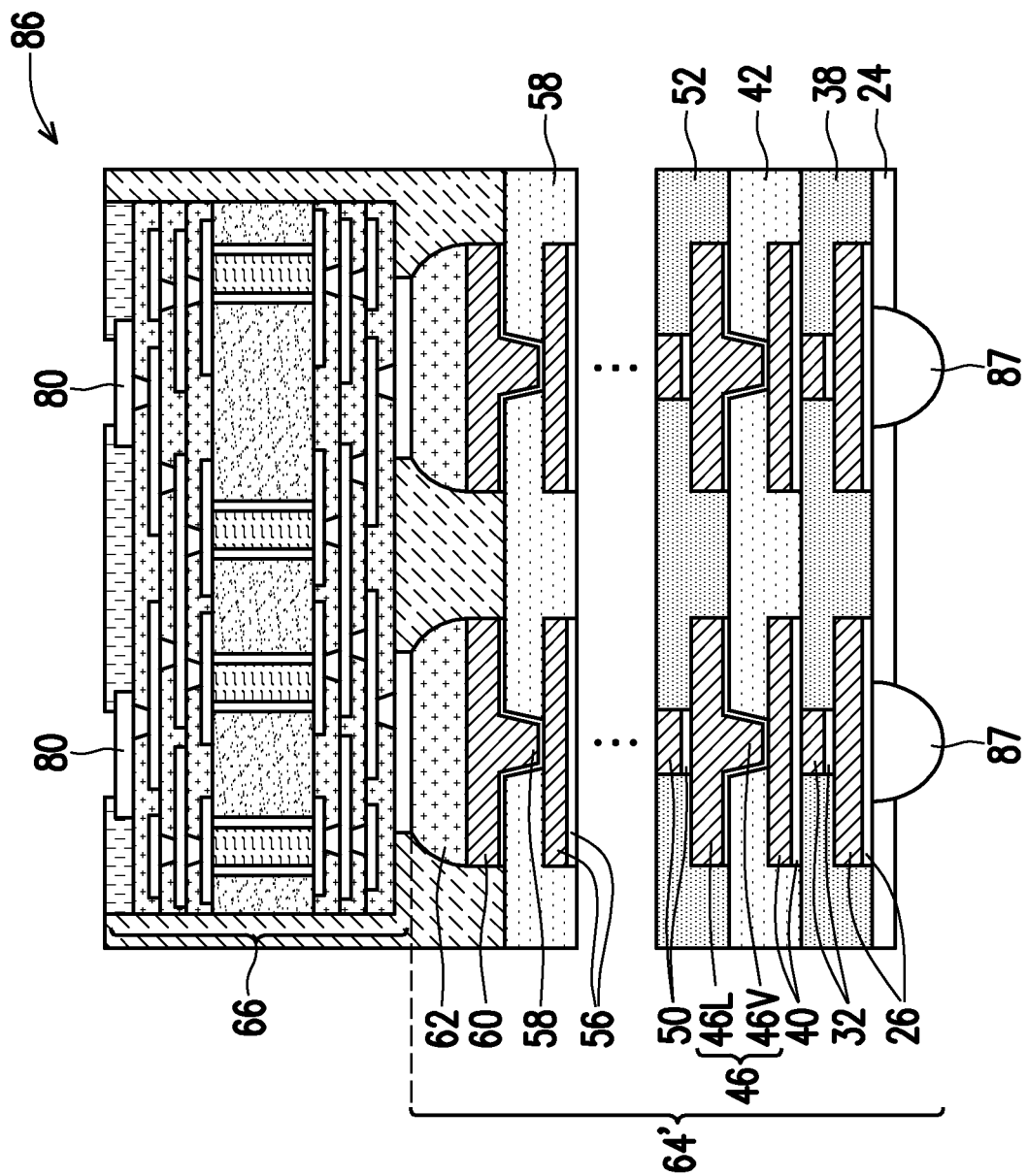

Next, composite package component 86 is demounted de-bonded from carrier 20, for example, by projecting a light on release film 22, with the light (such as a laser beam) penetrating through the transparent carrier 20. The respective process is illustrated as process 226 in the process flow 200 shown in FIG. 22. The release film 22 is thus decomposed, and composite package component 86 is released from carrier 20. The resulting structure is shown in FIG. 14. In subsequent processes, dielectric buffer layer 24 is patterned, for example, through a laser-drilling process. Electrical connectors 87, which may be solder regions, are formed to contact the metal pads in RDLs 26. The respective process is illustrated as process 228 in the process flow 200 shown in FIG. 22.

Figure 15:
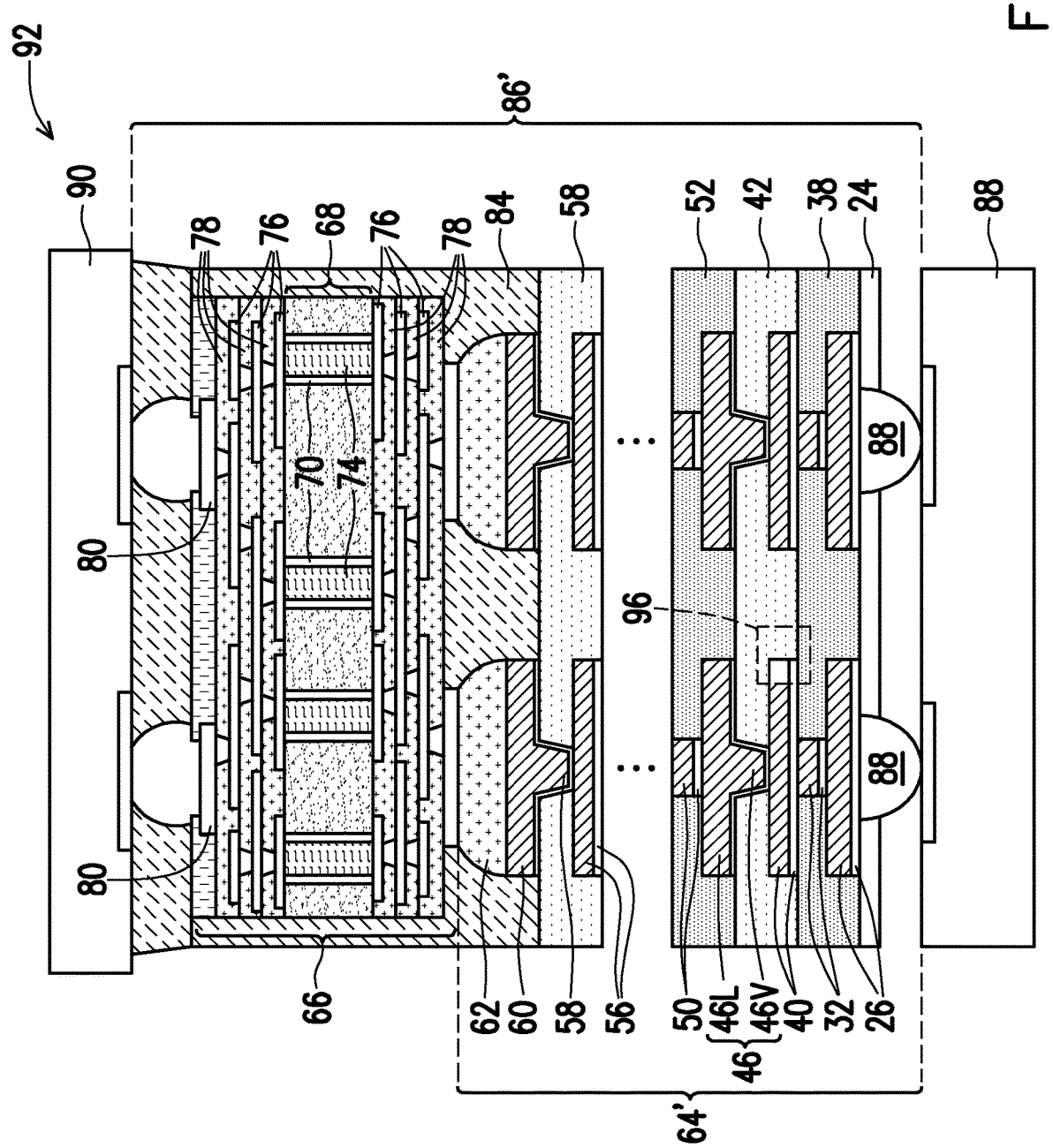

Composite package component 86 may then be singulated by sawing through encapsulant 84 and the underlying dielectric layers to form a plurality of identical package substrates. The respective process is illustrated as process 230 in the process flow 200 shown in FIG. 22. One of the singulated package substrates 86' is illustrated in FIG. 15. Package substrate 86' includes package substrate 64', which is singulated from the composite package substrate 64. In accordance with some embodiments, package substrate 86' is bonded to package components 88 and 90 to form package 92. The respective process is illustrated as process 232 in the process flow 200 shown in FIG. 22. In accordance with some embodiments of the present disclosure, package component 88 is a device die. In accordance with some embodiments of the present disclosure, package component 88 includes an interposer (not shown) and a device die (or a plurality of device dies, not shown) bonded to the interposer, with the interposer bonded to package substrate 64' directly. In accordance with some embodiments of the present disclosure, package component 88 includes an Integrated Fan-Out (InFO) package, which includes a device die (not shown) encapsulated in an encapsulant, and RDLs formed on the encapsulant and the device die. In accordance with other embodiments of the present disclosure, package component 88 includes a Chip-on-Wafer-on-Substrate (CoWoS) structure, which includes a chip bonded to a wafer, which is then sawed apart to form a package, with the package further bonded to a package substrate. Package component 90 may be or may comprise a printed circuit board, for example.

Figure 19A:
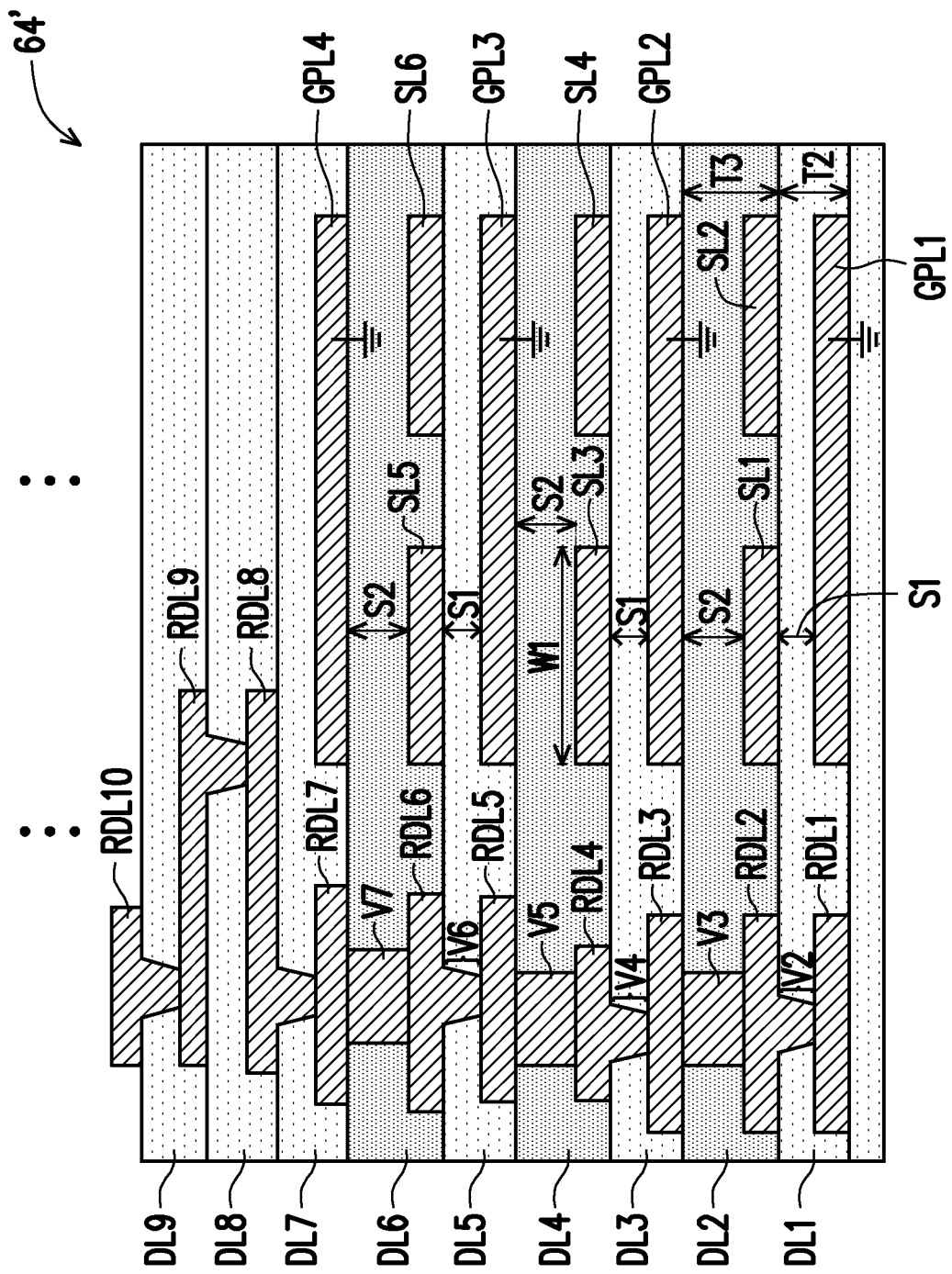
FIGS. 19A, 19B, and 20 illustrate two cross-sectional views and a top view, respectively, of transmission lines in accordance with some embodiments.

FIG. 19A illustrates a portion of package substrate 64'. In accordance with some embodiments, the illustrated structure includes dielectric layers DL1 through DL9 and more dielectric layers, which represent the dielectric layers 24, 38, 42, 52, 58, and the like in FIG. 12. Signal transmission lines SL1 through SL6 and ground panels GPL1 through GPL4 correspond to the RDLs 26, 40, 46, 56, and the like as shown in FIG. 12. Ground panels GPL1 through GPL4 are electrically grounded. Signal transmission lines SL1 through SL6 are between the corresponding ground panels GPL1, GPL2, GPL3, and GPL4, and may form single-line transmission line or differential transmission lines. In accordance with some embodiments of the present disclosure, transmission lines SL1 and SL2 may form a pair of differential transmission lines, and transmission lines SL3 and SL4 may form a pair of differential transmission lines. RDLs RDL1 through RDL10 and vias V1, V2, V3, V4, V5, V6, V7, and the like are also illustrated. The shapes of these vias correspond to the material and the formation methods of the corresponding dielectric layers, as discussed referring to FIGS. 2-6 and FIGS. 9-10.

The structure shown in FIG. 19A may correspond to some portions in package substrate 64' as shown in FIG. 12. For example, dielectric layers DL2, DL4, and DL6 may correspond to, and are formed using similar materials, similar formation methods, and having similar thicknesses as dielectric layers 38 and 52 (FIG. 12), which may be thicker, and may be formed of molding compound. Dielectric layers DL1, DL3, and DL5, and DL7-DL9 may correspond to, and are formed using similar materials, similar formation methods, and having similar thicknesses as dielectric layers 42 and 58 (FIG. 15), which may be thinner, and may be formed of a photo-sensitive material such as polyimide or PBO. FIG. 19A also illustrates the RDLs including pads and vias for vertical electrical connection, which correspond to the RDLs and vias shown in FIG. 12.

The structure shown in FIG. 19A and FIG. 15 may be used for forming high-speed transmission lines (such as differential transmission lines), and may be used for large packages, in which the transmission lines are long, and hence the insertion loss is high. To reduce the insertion loss, the line width W1 (FIG. 19A) of the transmission lines are preferably increased (for example, to be greater than about 15 μm or about 20 μm) so that the resistance of the transmission lines may be reduced. The increase in the width of the transmission lines, however, result in the impedance of the transmission lines to be adversely reduced, causing the mismatch of the impedance values between different parts of the package. In the embodiments of the present disclosure, spacing S2 (FIGS. 12 and 19A) between the transmission line (such as SL1/SL2/SL3/SL4) and one of the neighboring ground panel (such as GPL2) is increased, so that when the line width W1 is increased, the impedance is not reduced, and may be kept at a desirable value (For example, 100 ohms). In accordance with some embodiments, spacing S1 is not increased. This is because the formation of the RDLs in thicker dielectric layers (such as 38 in FIG. 12) are accompanied by two plating processes (such as in FIGS. 2 through 6), and the manufacturing cost is high. With S2 (FIG. 19A) being small, dielectric layers (such as DL1, DL3, DL5, etc.) may be formed using photo-sensitive materials, which means that the corresponding vias (such as 46V in FIG. 12) and RDL lines (such as 46L in FIG. 12) may be formed in the same process, and the manufacturing cost is not increased for forming these parts of the RDLs. Therefore, alternating thicker dielectric layers and thinner dielectric layers may balance the requirement of reducing insertion loss and keeping manufacturing cost low, while not reducing the impedance of the transmission lines.

The embodiments shown in FIG. 19A has relatively low cost since some dielectric layers such as layers DL1, DL3, DL5, and DL7 are formed of photo-sensitive materials, and the corresponding RDLs RDL2, RDL4, RDL6, etc. are formed using single-plating process (as shown in FIGS. 9 and 10). In accordance with other embodiments of the present disclosure, as shown in FIG. 19B, a high-performance structure is formed, in which more molding compound layers are adopted. Correspondingly, the RDLs in the molding compound layers are formed using two-plating formation methods (as shown in FIGS. 2-6). For example, in FIG. 19B, dielectric layers DL3 and DL5 (in addition to layers DL2, DL4, and DL6) may be formed of molding compound. Accordingly, spacing S1" may be increased, for example, to fall into the same range as spacing S2. The performance of the resulting structure may be further tuned and improved, although the cost is increased. This provides an option for the formation of circuits that demand certain performance. To suit to the using of molding compound for forming dielectric layers DL3 and DL5, vias V3, V5, and V7 and their overlying metal lines DL3, RDL5, and RDL7 are formed using two-plating processes (similar to the processes in FIGS. 2 through 6), as indicated by the shapes of vias V3, V5, and V7. It is appreciated that each of the structures as shown in FIGS. 19A and 19B may be incorporated into each of the embodiments shown in FIGS. 15, 16, 17, and 18.

In accordance with some embodiments, as shown in FIG. 19A, the dielectric layer (DL2, DL4 or DL6) immediately overlying transmission lines (SL1/SL2 or SL3/SL4) are thicker than the dielectric layers (DL1, DL3, or DL5) immediately underlying transmission lines. In accordance with alternative embodiments, the dielectric layer (DL2, DL4 or DL6) immediately overlying transmission lines (SL1/SL2 or SL3/SL4) are thinner than the dielectric layers (DL1, DL3, or DL5) immediately underlying transmission lines. In which embodiments, the thinner dielectric layers DL2, DL4 and DL6 will be formed using photo-sensitive material (for example), while the thicker DL1, DL3 and DL5 will be formed using heterogeneous materials such as molding compound.

Figure 19B:
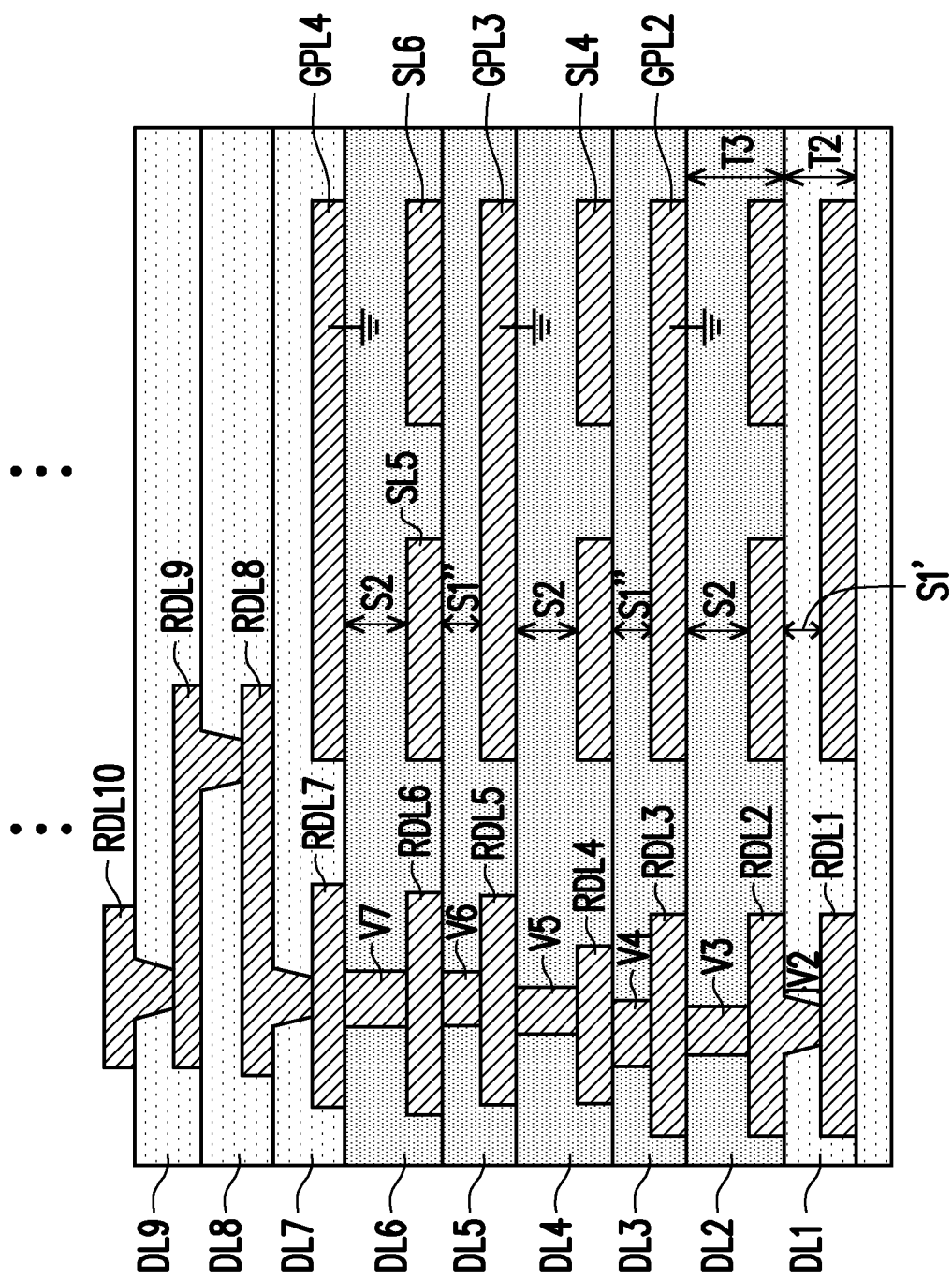
Figure 20:
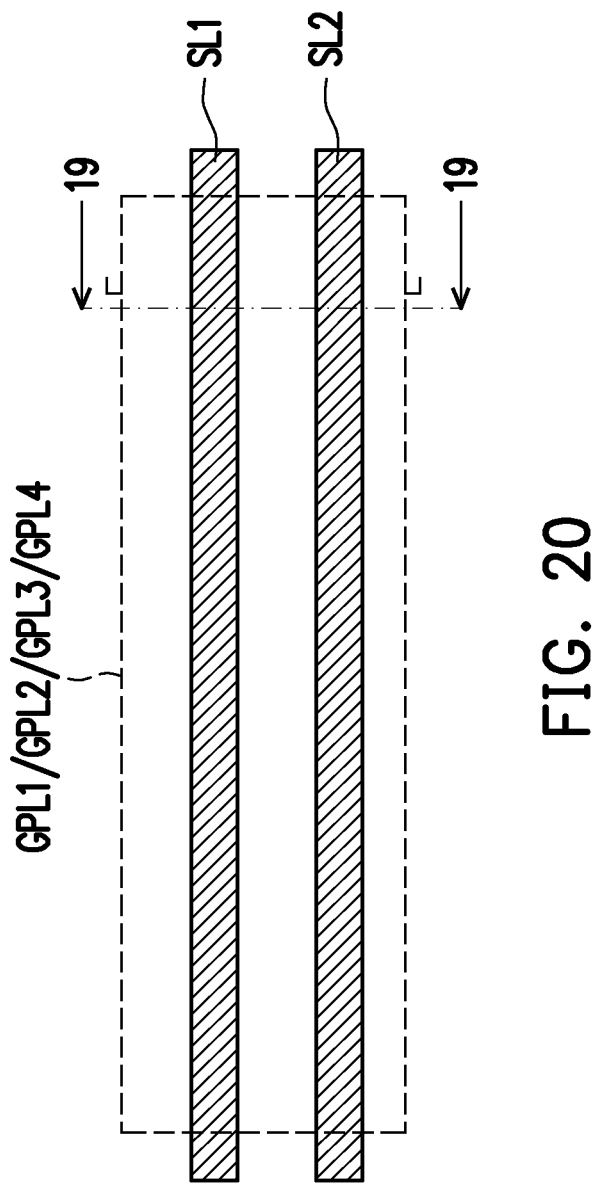

FIG. 20 schematically illustrates a plane view of transmission lines SL1 and SL2, wherein the cross-sectional view shown in FIGS. 19A and 19B may be obtained from reference cross-section 19-19 in FIG. 20. The example shape of ground panels GPL1, GPL2, GPL3, and GPL4 are also shown using dashed lines.

Referring back to FIG. 15, in accordance with some embodiments, package substrates 64' include horizontal high-speed transmission lines, and hence package substrates 64' is used to route high-speed (such as high-frequency) signals. Package substrate 66 may be used for routing power or low-speed signals. Accordingly, the dielectric layers in package substrate 66 may be thick or thin without affecting the performance of the resulting circuit.

In accordance with some embodiments, some of the RDLs in package substrates 64' are used for routing horizontal high-speed transmission lines, while other RDLs do not have high-speed transmission lines routed horizontally therein. In accordance with some embodiments, the dielectric layers (such as layers DL1-DL6 in FIG. 19A) with horizontal high-speed transmission lines therein may adopt the alternating scheme, while other dielectric layers (such as DL7-DL9 in FIG. 19A) not having horizontal high-speed transmission lines may be formed using photo-sensitive materials, with the RDLs therein formed using the scheme in FIGS. 9 and 10. For example, the several RDL layers (such as RDLs 26, 40, and 46 in FIG. 15), which are closer to package component 88 may be used for routing high-speed transmission lines, while the overlying RDL layers up to RDLs 56 may be formed in photo-sensitive materials. The materials of the dielectric layers are thus selected accordingly.

Figure 16:
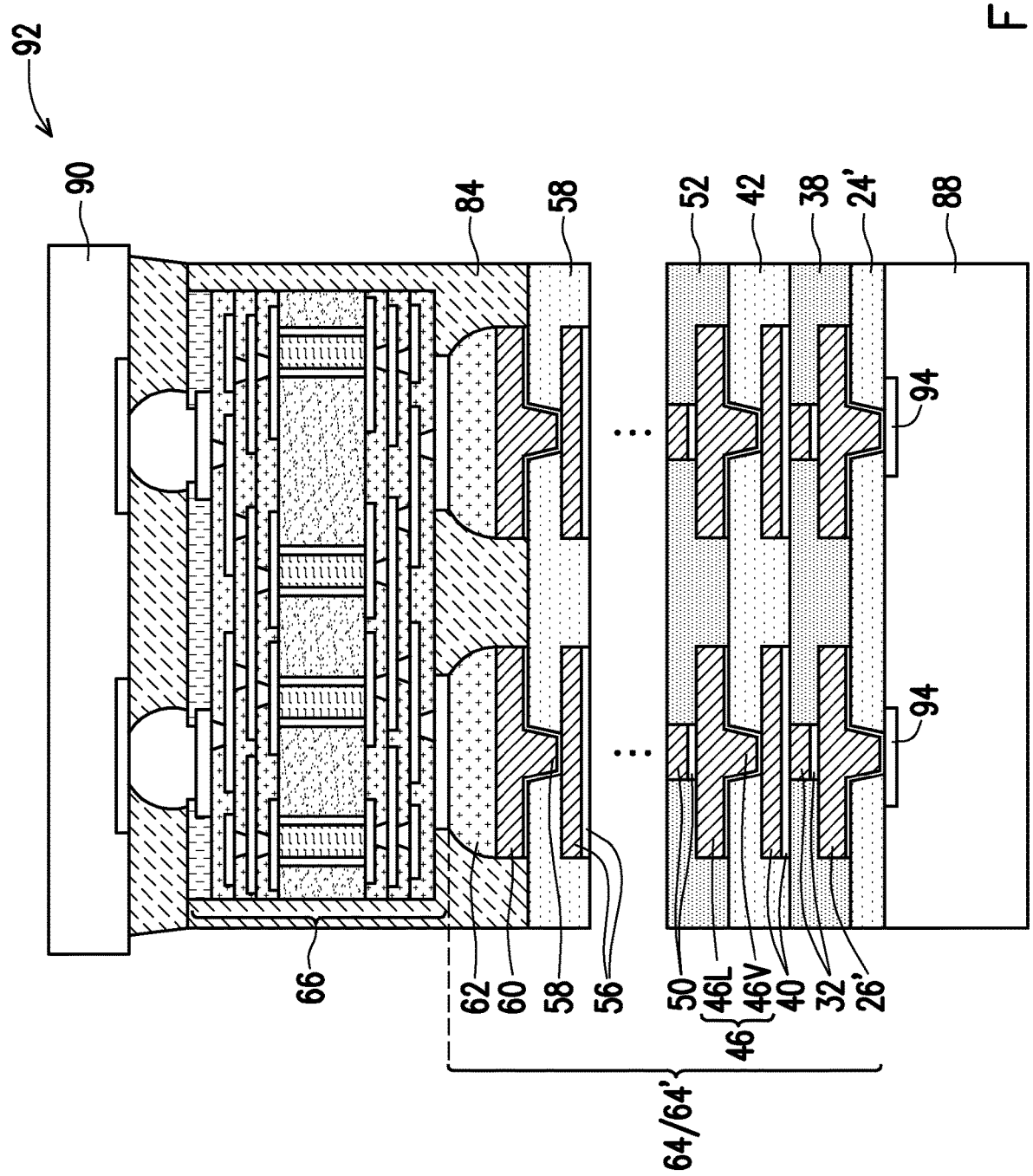
FIGS. 16 through 18 illustrate the cross-sectional views of packages in accordance with some embodiments.

The package formation process as shown in FIGS. 1 through 15 are referred to as having an RDL-first scheme, in which RDLs in package substrate 64' are formed before package component 88 is bonded. FIG. 16 illustrates package 92 formed using a RDL-last scheme. In the formation of package 92, package component 88 is provided first, with metal pads 94 being at the surface of package component 88. Next, package substrate 64 is formed layer-by-layer on package component 88. For example, dielectric layer 24', which is formed of a photo-sensitive (homogeneous) material is first formed, and RDLs 26' are formed, and extending into dielectric layer 24' to contact metal pads 94. In subsequent processes, dielectric layers 38, 42, and 52 and RDLs/vias 32, 40, and 46, 50, and 56, etc. are formed. Package substrate 66 is then bonded to package substrate 64, and is encapsulated in encapsulant 84. The resulting composite package component is then singulated to form a plurality of packages 92, which include package substrates 64' therein.

Figure 17:
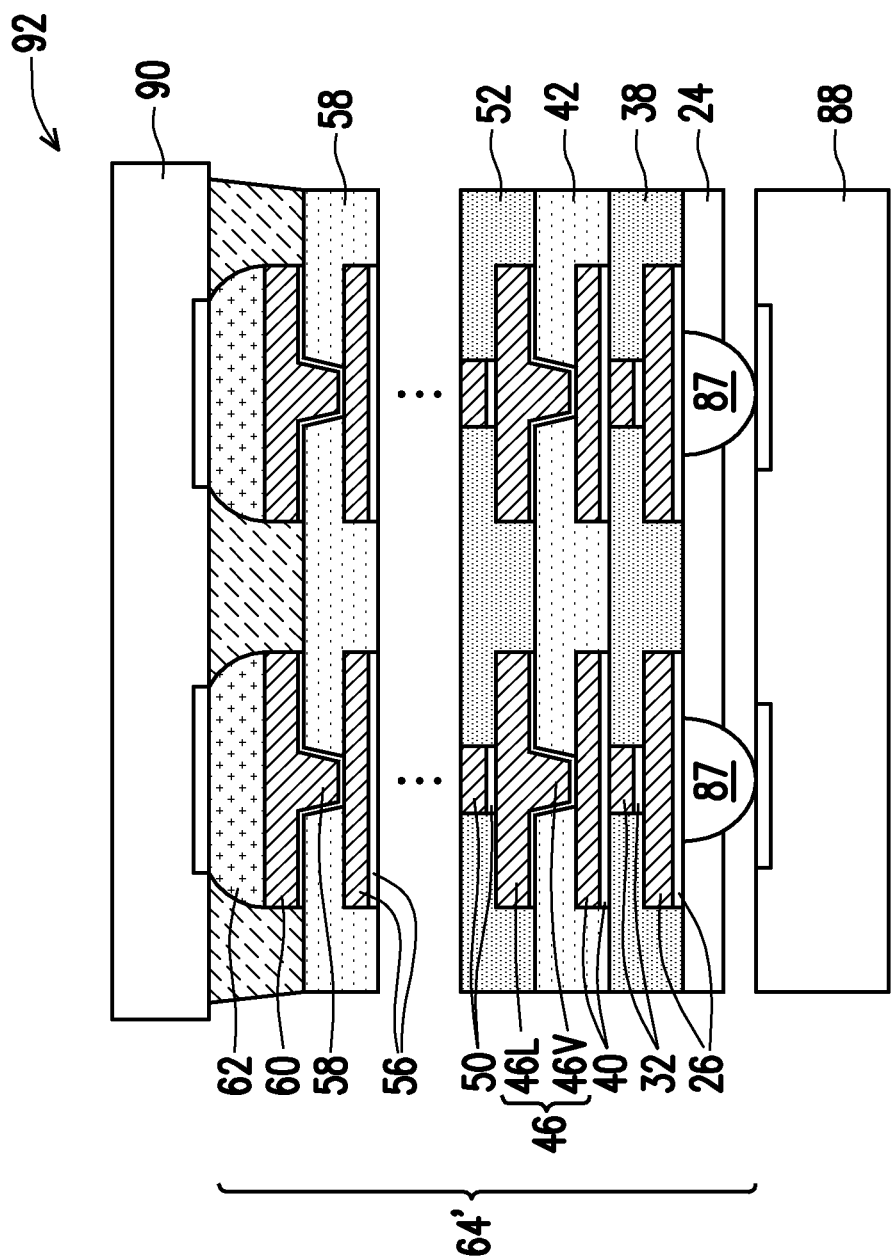

FIG. 17 illustrates package 92 in accordance with some embodiments. These embodiments are similar to the package in FIG. 15 (using RDL-first approach), except that the package substrate 66 as shown in in FIG. 15 is not used. Instead, package component 90 is bonded to package substrate 64' directly.

Figure 18:
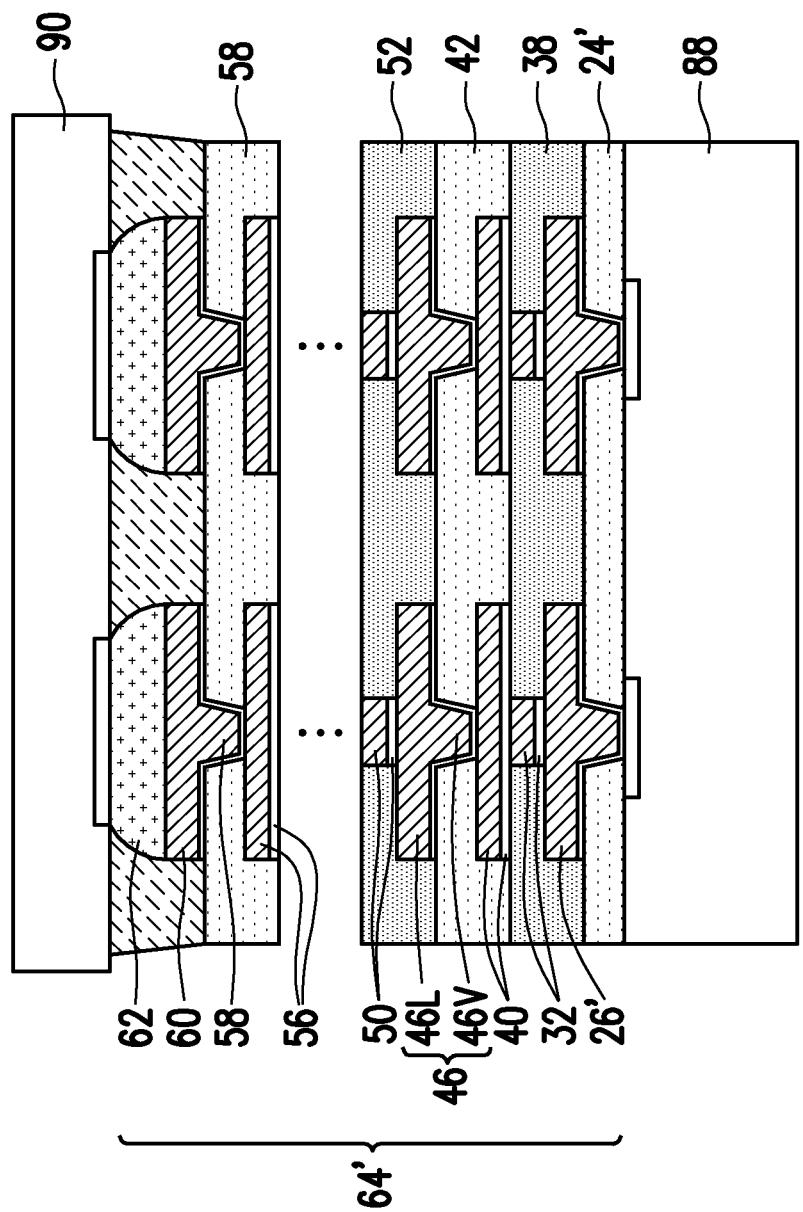

FIG. 18 illustrates package 92 in accordance with some embodiments. These embodiments are similar to what are shown in FIG. 16 (using RDL-last approach), except that the package substrate 66 is not used. Instead, package component 90 is bonded to package substrate 64' directly.

Figure 21:
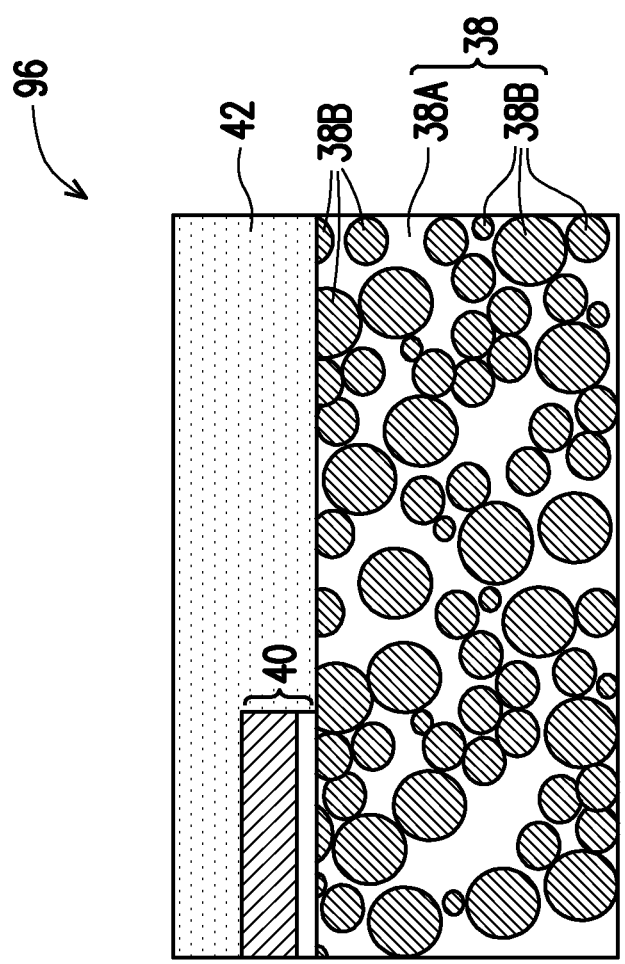
FIG. 21 illustrates an amplified view of a region in a package in accordance with some embodiments.

FIG. 21 illustrates an amplified view of region 96 in FIG. 15, which illustrates a part of (a heterogeneous material such as) dielectric layer 38, a part of dielectric layer 42, and a part of RDL 40. As aforementioned, dielectric layer 38 may include base material 38A such as an epoxy, a resin, a polymer, and the like, and spherical particles 38B. Due to the planarization process, the top parts of some spherical particles 38B may be removed to form partial particles, which have planar top surfaces that are coplanar with the planar top surface of base material 38A. The bottom surface of dielectric layer 42 contacts the planar top surfaces of partial particles 38B and base material 38A. Dielectric layer 42, on the other hand, may be homogeneous, and do not include particles therein.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By using molding compound or the like material on one side (top side or bottom side) of transmission lines, the widths of the transmission lines may be increased (to reduce resistance) without resulting in the undesirable reduction of the impedance of the transmission lines. On the other side (bottom side or top side), a photo-sensitive material may be used to reduce the manufacturing cost. Accordingly, the performance of the circuits and the manufacturing cost are balanced in the embodiments of the present disclosure.

In accordance with some embodiments of the present disclosure, a method comprises forming a first redistribution line; forming a first polymer layer comprising a first portion encircling the first redistribution line, and a second portion overlapping the first redistribution line; forming a pair of differential transmission lines over and contacting the first polymer layer; molding the pair of differential transmission lines in a first molding compound, wherein the first molding compound comprises a first portion encircling the pair of differential transmission lines, and a second portion overlapping the pair of differential transmission lines; and forming an electrical connector over and electrically coupling to the pair of differential transmission lines. In an embodiment, the method further comprises, when the pair of differential transmission lines is formed, simultaneously forming a second redistribution line; forming a via over and contacting the second redistribution line; and performing a planarization process to level top surfaces of the via and the first molding compound. In an embodiment, the forming the second redistribution line comprises a first plating process, and the forming the via comprises a second plating process. In an embodiment, the method further comprises forming a first ground panel overlapped by the pair of differential transmission lines, wherein the pair of differential transmission lines is spaced apart from the first ground panel by a first spacing; and forming a second ground panel overlapping the pair of differential transmission lines, wherein the pair of differential transmission lines is spaced apart from the second ground panel by a second spacing greater than the first spacing. In an embodiment, the first molding compound comprises a base material and filler particles in the base material, and the first polymer layer is formed of a homogeneous material. In an embodiment, the method further comprises bonding a first package substrate to the electrical connector; and performing a singulation process to saw through the first polymer layer and the first molding compound into a second package substrate. In an embodiment, the method further comprises forming a second polymer layer over and contacting the first molding compound; and forming a second molding compound over and contacting the second polymer layer.

In accordance with some embodiments of the present disclosure, a method comprises forming a plurality of polymer layers; forming a plurality of molding compound layers, wherein the plurality of polymer layers and the plurality of molding compound layers are formed alternatingly, and wherein each of the plurality of molding compound layers is formed by processes comprising: dispensing a molding compound material; and performing a planarization process to level a top surface of the molding compound material; forming a first redistribution line in each of the plurality of polymer layers; and forming a second redistribution line in each of the plurality of molding compound layers. In an embodiment, one of the plurality of molding compound layers is thicker than both of a first and a second polymer layer in the plurality of polymer layers, with the first polymer layer being overlying and contacting the one of the plurality of molding compound layers, and the second polymer layer being underlying and contacting the one of the plurality of molding compound layers. In an embodiment, the plurality of polymer layers are not planarized by planarization processes. In an embodiment, the method further comprises forming a plurality of vias, each in one of the plurality of molding compound layers, and each of the plurality of vias and a corresponding underlying redistribution line are formed in separate processes. In an embodiment, each of the plurality of vias is planarized by a corresponding planarization process. In an embodiment, the method further comprises bonding a package substrate to electrically coupling to the first redistribution line. In an embodiment, the method further comprises forming a pair of differential transmission lines in one of the plurality of polymer layers and the plurality of molding compound layers. In an embodiment, the method further comprises forming a first ground panel over the pair of differential transmission lines, wherein the pair of differential transmission lines is spaced apart from the first ground panel by a first spacing; and forming a second ground panel under the pair of differential transmission lines, wherein the pair of differential transmission lines is spaced apart from the second ground panel by a second spacing different from the first spacing. In an embodiment, the pair of differential transmission lines is in one of the plurality of molding compound layers, and the first ground panel and the second ground panel are in two of the plurality of polymer layers, and the first spacing is greater than the second spacing.

In accordance with some embodiments of the present disclosure, a package comprises a plurality of polymer layers, wherein the plurality of polymer layers have first thicknesses; a plurality of molding compound layers, wherein the plurality of polymer layers and the plurality of molding compound layers are positioned alternatingly, and wherein the plurality of molding compound layers have second thicknesses greater than the first thicknesses; a first redistribution line in each of the plurality of polymer layers; and a second redistribution line in each of the plurality of molding compound layers. In an embodiment, the package further comprises a pair of differential transmission lines in one of the plurality of polymer layers and the plurality of molding compound layers. In an embodiment, the package further comprises a first ground panel over the pair of differential transmission lines, wherein the pair of differential transmission lines is spaced apart from the first ground panel by a first spacing; and a second ground panel under the pair of differential transmission lines, wherein the pair of differential transmission lines is spaced apart from the second ground panel by a second spacing different from the first spacing. In an embodiment, the plurality of polymer layers and the plurality of molding compound layers are parts of a first package substrate, and the package further comprises a second package substrate bonded to the first package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
    forming a first redistribution line;
    forming a first polymer layer comprising a first portion encircling the first redistribution line, and a second portion overlapping the first redistribution line;
    forming a pair of differential transmission lines over and contacting the first polymer layer;
    when the pair of differential transmission lines is formed, simultaneously forming a second redistribution line;
    forming a via over and contacting the second redistribution line;
    molding the pair of differential transmission lines and the via in a first molding compound, wherein the first molding compound comprises a first portion encircling the pair of differential transmission lines, and a second portion overlapping the pair of differential transmission lines and the via;
    performing a planarization process to level top surfaces of the via and the first molding compound; and
    forming an electrical connector over and electrically coupling to the pair of differential transmission lines.

2. The method of claim 1, wherein the forming the second redistribution line comprises a first plating process, and the forming the via comprises a second plating process.

3. The method of claim 1 further comprising:
forming a first ground panel overlapped by the pair of differential transmission lines, wherein the pair of differential transmission lines is spaced apart from the first ground panel by a first spacing; and
forming a second ground panel overlapping the pair of differential transmission lines, wherein the pair of differential transmission lines is spaced apart from the second ground panel by a second spacing greater than the first spacing.

4. The method of claim 1, wherein the first molding compound comprises a base material and filler particles in the base material, and the first polymer layer is formed of a homogeneous material.

5. The method of claim 1 further comprising:
bonding a first package substrate to the electrical connector; and
performing a singulation process to saw through the first polymer layer and the first molding compound into a second package substrate.

6. The method of claim 1 further comprising:
forming a second polymer layer over and contacting the first molding compound; and
forming a second molding compound over and contacting the second polymer layer.

7. The method of claim 1, wherein the forming the first polymer layer comprises dispensing the first polymer layer in a flowable form, and curing the first polymer layer, and wherein the first molding compound comprises a base material and filler particles in the base material.

8. A method comprising:
forming a plurality of polymer layers;
forming a plurality of molding compound layers, wherein the plurality of polymer layers and the plurality of molding compound layers are formed alternatingly, and wherein each of the plurality of molding compound layers is formed by processes comprising:
dispensing a molding compound material; and
performing a planarization process to level a top surface of the molding compound material;
forming a first redistribution line in each of the plurality of polymer layers; and
forming a second redistribution line in each of the plurality of molding compound layers.

9. The method of claim 8, wherein one of the plurality of molding compound layers is thicker than both of a first and a second polymer layer in the plurality of polymer layers, with the first polymer layer being overlying and contacting the one of the plurality of molding compound layers, and the second polymer layer being underlying and contacting the one of the plurality of molding compound layers.

10. The method of claim 8, wherein the plurality of polymer layers are not planarized by planarization processes.

11. The method of claim 8 further comprising forming a plurality of vias, each in one of the plurality of molding compound layers, and each of the plurality of vias and a corresponding underlying redistribution line are formed in separate processes.

12. The method of claim 11, wherein each of the plurality of vias is planarized by a corresponding planarization process.

13. The method of claim 8 further comprising bonding a package substrate to electrically coupling to the first redistribution line.

14. The method of claim 8 further comprising forming a pair of differential transmission lines in one of the plurality of polymer layers and the plurality of molding compound layers.

15. The method of claim 14 further comprising:
forming a first ground panel over the pair of differential transmission lines, wherein the pair of differential transmission lines is spaced apart from the first ground panel by a first spacing; and
forming a second ground panel under the pair of differential transmission lines, wherein the pair of differential transmission lines is spaced apart from the second ground panel by a second spacing different from the first spacing.

16. The method of claim 15, wherein the pair of differential transmission lines is in one of the plurality of molding compound layers, and the first ground panel and the second ground panel are in two of the plurality of polymer layers, and the first spacing is greater than the second spacing.

17. A method comprising:
forming a plurality of polymer layers, wherein the plurality of polymer layers have first thicknesses, and wherein each of the plurality of polymer layer is formed of a homogeneous material;
forming a first plurality of vias, each in one of the plurality of polymer layers, wherein first top surfaces of the first plurality of vias are coplanar with second top surfaces of corresponding ones of the plurality of polymer layers;
forming a plurality of molding compound layers, wherein each of the plurality of molding compound layers comprises a base material and filler particles in the base material, and wherein the plurality of polymer layers and the plurality of molding compound layers are positioned alternatingly; and
forming a second plurality of vias, each in one of the plurality of molding compound layers, wherein third top surfaces of the second plurality of vias are coplanar with fourth top surfaces of corresponding ones of the plurality of molding compound layers.

18. The method of claim 17, wherein each of the first plurality of vias forms a distinguishable interface with a corresponding first overlying metal line, and each of the second plurality of vias is continuously connected to a corresponding second overlying metal line without distinguishable interface therebetween.

19. The method of claim 17, wherein each of the first plurality of vias and the second plurality of vias further forms a distinguishable interface with a corresponding underlying metal line.

20. The method of claim 17, wherein the forming the plurality of polymer layers are free from planarization processes, and wherein each of the plurality of molding compound layers is formed by a dispensing process and a planarization process.

* * * * *